United States Patent
Wolters et al.

(10) Patent No.: US 9,154,102 B2
(45) Date of Patent: Oct. 6, 2015

(54) SYSTEM FOR COMBINING LOUDNESS MEASUREMENTS IN A SINGLE PLAYBACK MODE

(75) Inventors: Martin Wolters, Nürnberg (DE); Michael Schug, Erlangen (DE); Harald Mundt, Fürth (DE); Jeffrey Riedmiller, Penngrove, CA (US)

(73) Assignees: Dolby Laboratories Licensing Corporation, San Francisco, CA (US); Dolby International AB, Amsterdam (NL)

( * ) Notice: Subject to any disclaimer, the term of this patent is extended or adjusted under 35 U.S.C. 154(b) by 421 days.

(21) Appl. No.: 13/581,453

(22) PCT Filed: Mar. 7, 2011

(86) PCT No.: PCT/EP2011/053389
§ 371 (c)(1),
(2), (4) Date: Aug. 27, 2012

(87) PCT Pub. No.: WO2011/110525
PCT Pub. Date: Sep. 15, 2011

(65) Prior Publication Data
US 2012/0328115 A1 Dec. 27, 2012

Related U.S. Application Data

(60) Provisional application No. 61/312,561, filed on Mar. 10, 2010.

(51) Int. Cl.
*H03G 3/00* (2006.01)
*H03G 9/00* (2006.01)
*H03G 9/14* (2006.01)

(52) U.S. Cl.
CPC ............... *H03G 9/00* (2013.01); *H03G 9/005* (2013.01); *H03G 9/14* (2013.01)

(58) Field of Classification Search
CPC ............ H03G 3/00; H03G 7/00; H03G 3/002
USPC ...................... 381/56–57, 104–109
See application file for complete search history.

(56) References Cited

U.S. PATENT DOCUMENTS 7,013,013 B2 * 3/2006 Takei ............................ 381/307
7,058,188 B1  6/2006 Allred
(Continued)

FOREIGN PATENT DOCUMENTS

JP  H08-293799  11/1996
JP  H09-6399  1/1997
(Continued)

OTHER PUBLICATIONS

Robinson D J M "Perceptual Model for Assessment of Coded Audio" Thesis Submitted for the Degree of Doctor of Philosophy University of Essex, Mar. 1, 2002, pp. 278-307.
(Continued)

*Primary Examiner* — Disler Paul

(57) ABSTRACT

The present document relates to processing of multimedia data, notably the encoding, the transmission, the decoding and the rendering of multimedia data, e.g. audio files or bitstreams. In particular, the present document relates to the implementation of loudness control in multimedia players. A method for providing loudness related data to a media player is described. The method comprises the steps of providing a first loudness related value associated with an audio signal; wherein the first loudness related value has been determined according to a first procedure; of converting the first loudness related value into a second loudness related value using a reversible relation; wherein the second loudness related value is associated with a second procedure for determining loudness related values; of storing the second loudness related value in metadata associated with the audio signal; and of providing the metadata to the media player.

17 Claims, 7 Drawing Sheets

(56) References Cited

U.S. PATENT DOCUMENTS

| | | | |
|---|---|---|---|
| 7,398,207 B2* | 7/2008 | Riedl | 704/225 |
| 7,454,331 B2 | 11/2008 | Vinton | |
| 8,615,316 B2* | 12/2013 | Oh et al. | 700/94 |
| 2005/0195982 A1* | 9/2005 | Olive | 381/59 |
| 2010/0027812 A1* | 2/2010 | Moon et al. | 381/107 |

FOREIGN PATENT DOCUMENTS

| | | |
|---|---|---|
| JP | 2005-027273 | 1/2005 |
| JP | 5166241 | 9/2008 |
| JP | 2009-296298 | 12/2009 |
| TW | I440018 | 3/2009 |
| TW | 200948172 | 11/2009 |
| WO | 2007/120453 | 10/2007 |
| WO | 2011/100155 | 8/2011 |

OTHER PUBLICATIONS

Anonymous: "Recommendation ITU-R BS.1770-1 Algorithm to Measure Audio Programme Loudness and True-Peak Audio Level" ITU, Jan. 1, 2006, pp. 1-19.

* cited by examiner

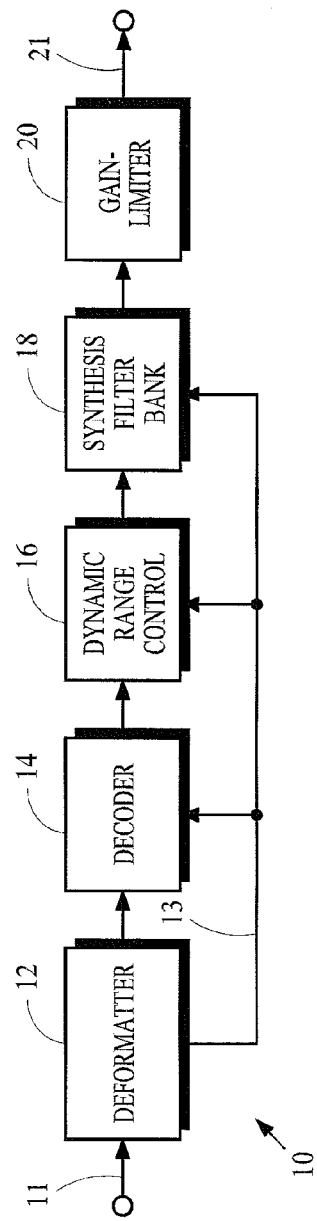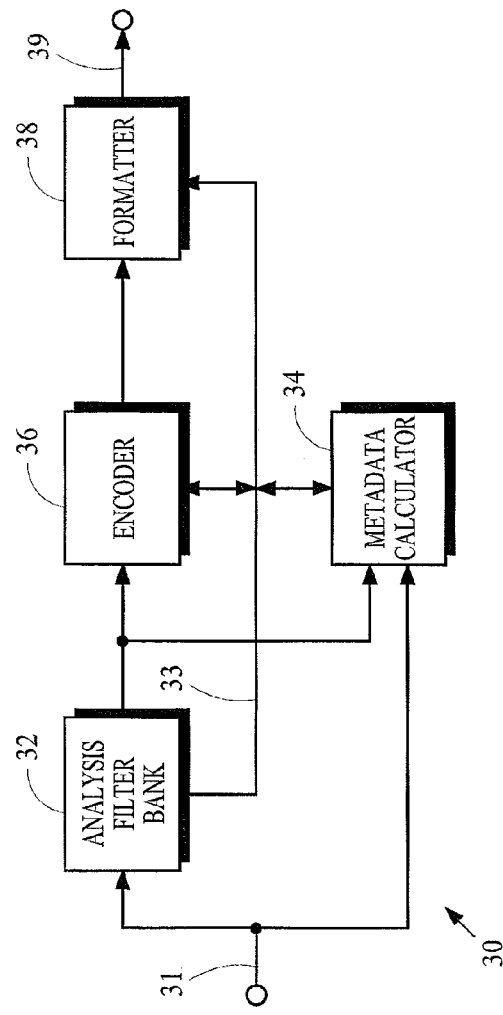
Fig. 3
Fig. 4

US 9,154,102 B2

SYSTEM FOR COMBINING LOUDNESS MEASUREMENTS IN A SINGLE PLAYBACK MODE

TECHNICAL FIELD

The present document relates to processing of multimedia data, notably the encoding, the transmission, the decoding and the rendering of multimedia data, e.g. audio files or bitstreams. In particular, the present document relates to the implementation of loudness control in multimedia players.

BACKGROUND OF THE INVENTION

The problem of varying mixing and playback levels of audio content is addressed in the movie industry by specifying the SMPTE (Society of Motion Picture and Television Engineers) recommendations which guarantee a consistent playback level across movie theaters and for different content. The SMPTE recommendations ensure that audio content is re-produced at a consistent level pleasant to consumers.

The situation in broadcast is more challenging, given that the individual playback systems of users are not controlled by technicians and due to the more complex distribution channels and networks for broadcast. With the introduction of digital broadcast, the industry established the concept of time-varying-metadata which enables to control gain-values at the receiving end to tailor content to a specific listening environment. An example is the metadata included in Dolby Digital which includes general loudness normalization information ("dialnorm") for dialogues, as well as gain-words ("dynrng" and "compr") to reduce the dynamic range of a program. It should be noted that throughout this specification and in the claims, references to Dolby Digital shall be understood to encompass both the Dolby Digital and Dolby Digital Plus coding systems. Such systems are specifically powerful for situations where the operating modes at the receiver relating to the listening environment and the listening preferences are specified. By way of example, the dialnorm standard allows the specification of a so called "line mode" and "RF mode" for Dolby Digital. The "RF mode" is designed for peak limiting situations where the decoded program is intended for delivery through an RF input on a television, such as through the antenna output of a set-top box. The "Line mode" provides less compression of the dynamic range than the "RF mode" and also allows user adjustment of the low-level boost and high-level cut parameters within a home decoder. The adjustment or "scaling" of the boost and cut areas allows the user to customize the audio reproduction for their specific listening environment. These technologies are also part of today's audio/video discs like DVD and Blu-ray.

An important distribution channel for audio content is still the CD which contains 16-bit PCM data without any metadata. The peak-normalization typically used for CD's is said to be the main reason for the so called "loudness war" which has led to reduced dynamic range of audio content with high average audio levels. However, consumer behavior changed over recent years with coded content (e.g. content in data-reduced formats such as mp3) becoming more popular and important for content distribution and storage. Such formats allow for virtually unlimited dynamic range which content owners and audio enthusiasts can take advantage of. In addition, the increasing popularity of mobile phones, smart phones and other portable electronic devices as personal media players has created new challenges in designing high quality playback devices that meet customer expectations of consistent audio leveling and best audio quality under various listening conditions. The large number of content in personal music collections (often exceeding thousands of files) as well as the broad range of audio formats such as mp3, HE-AAC, OGG, WMA, and Dolby Digital further complicate the problem of providing audio playback devices with consistent audio leveling.

SUMMARY OF THE INVENTION

The present document addresses the problem of providing consistent audio leveling using normalized loudness values in electronic devices, e.g. media players. Particular emphasis is put on the challenges of such devices, i.e. notably the varying listening environments which influence the desired output level as well as the maximum dynamic range tolerance and the wide range of different sources and formats of the audio content which makes it difficult to playback all content at the same desired output level. Furthermore, aspects such as computational complexity and codec-agnostic applicability of normalized loudness values in portable media players may be taken into account. In addition, the solution should be non-destructive with regards to the rendered content, i.e. the actual PCM signal or payload prior to the decoding stage should remain unchanged. A possible approach to address the latter issue is the use of metadata which is stored and/or sent along with the multimedia file or bitstream.

According to an aspect, a method for providing loudness related data to a media player is described. The media player may be e.g. a mobile phone, a smart phone, a mp3 player, a laptop or a personal media player. Loudness related data may be a loudness value or a loudness related value which is associated with an audio signal. The audio signal may be stored as samples in a media file, e.g. an mp3 file, a WMA file or an iTunes media file. Alternatively or in addition, the audio signal may be provided as a bitstream, e.g. an AAC, HE-AAC, Dolby Pulse or Dolby Digital bitstream.

The method may comprise the step of providing a first loudness related value associated with the audio signal, wherein the first loudness related value has been determined according to a first procedure or algorithm. A loudness related value may also be referred to as leveling information. A procedure or algorithm for determining a loudness related value may be a set of manipulations of the audio signal in order to determine a loudness related value which represents the perceptual loudness, i.e. the perceived energy, of an audio signal. Such procedure or algorithm may be the ITU-R BS.1770 algorithm to measure audio programme loudness and/or the Replay Gain loudness calculation scheme. In an embodiment, the first procedure may be the ITU-R BS.1770 algorithm and the first loudness related value may be the BS.1770 loudness value. It should be noted that variants of the ITU-R BS.1770 algorithm, e.g. a variant which does not consider silence periods of the audio signal, may also be used.

The method may comprise the step of converting the first loudness related value into a second loudness related value using a model comprising a reversible relation, wherein the second loudness related value is associated with a second procedure for determining loudness related values. In an embodiment, the second procedure may be the Replay Gain loudness calculation scheme. In such a case, the second loudness value may be the Replay Gain adjustment value, i.e. a gain value amplifying or attenuating the audio signal to a predetermined output level. Typically, the second loudness related value when derived by conversion from the first loudness related value is an estimate of a loudness related value which is determined for the audio signal according to the second procedure or algorithm. This is due to the fact that the model comprising a reversible relation may be an approximation of the actual relationship between the loudness related values determined by the first and second procedure.

The reversible relation may be a linear relation between the first loudness related value and the second loudness related value measured in the logarithmic space, e.g. measured in dB. Such a reversible relation may be obtained by determining a plurality of first loudness related values associated with a corresponding plurality of audio signals, wherein the plurality of first loudness related values is determined according to the first procedure. Furthermore a plurality of second loudness related values associated with the corresponding plurality of audio signals may be determined, wherein the plurality of second loudness related values is determined according to the second procedure. A model comprising one or more model parameters may be fitted to the plurality of pairs of first and second loudness related values. The model may be fitted and the model parameters may be determined using an error minimization scheme, e.g. using a least mean square error criterion, a total least squares error criterion or a least absolute deviation error criterion, thereby yielding the reversible relation. In an embodiment a median error criterion may be used. By way of example, the model parameters may be determined such that the median of the estimation error of the second loudness related value may be zero. The reversible relation may also be determined using linear regression.

The method may comprise the step of storing the second loudness related value in metadata associated with the audio signal. The metadata may have a pre-determined syntax or format. In an embodiment, the pre-determined format uses the Replay Gain syntax. Alternatively or in addition, the pre-determined format may be compliant with iTunes-style metadata or ID3v2 tags. In another embodiment, the first loudness related value may be transmitted in a Dolby Pulse or HE-AAC bitstream as a Fill Element, e.g. as a "program reference level" parameter, according to the MPEG standard ISO 14496-3.

The method may comprise the step of providing the metadata to the media player. The metadata may be provided along with the audio signal. In an embodiment, the audio signal and the metadata may be stored in one or more files. The files may be stored on a storage medium, e.g. random access memory (RAM) or compact disk. In an embodiment, the audio signal and the metadata may be transmitted to the media player, e.g. within a media bitstream such as HE-AAC.

As outlined above, the first and/or the second procedure for determining loudness related values may be the ITU-R BS.1770 algorithm to measure audio programme loudness and/or the Replay Gain loudness calculation scheme. Typically, the first and the second procedure are different. The first and/or the second procedure may comprise the step of processing the audio signal in accordance to human loudness perception, e.g. using A-weighting and/or K-weighting. Furthermore, the procedure may comprise the step of determining the energy of one or more portions of the processed audio signal. In addition, the procedure may comprise the step of offsetting the energy to determine a loudness related value. Such offsetting may be performed to normalize the loudness related value to the Full Scale (FS). Alternatively or in addition, a gain value may be derived by offsetting the energy with a target energy. In other words, a gain value may be determined as the offset between the energy and a target energy. This gain value may also be referred to as a loudness related value.

In an embodiment, the reversible relation may be a polynomial of first or second order. In particular, the reversible relation may be given by $L_2 = A + BL_1$, wherein $L_2$ is the second loudness related value in the logarithmic space (e.g. dB), $L_1$ is the first loudness related value in the logarithmic space (e.g. dB) and A and B are real numbers with $-17 \leq A \leq -15$ and/or $-0.7 \leq B \leq -0.9$. A and B may take on any of the real numbers in the above intervals. In particular, $-16.1 \leq A \leq 15.9$ or $-16.01 \leq A \leq 15.99$ or $A = -16.00$. In particular, $-0.80 \leq B \leq -0.82$ or $-0.811 \leq B \leq -0.813$ or $B = -0.812$.

Alternatively, B may be restricted to $B = -1.0$. In this case, the relationship between the power measurements for the first and second loudness related value is modeled by a constant factor. Furthermore, A may be set as $-19 \leq A \leq -18$, or $-18.4 \leq A \leq -18.3$, or $-18.31 \leq A \leq -18.29$ or $A = -18.30$ or $A = -18.10$ or $A = -18.00$.

The reversible relation may be given by $L_2 = A + BL_1 + CL_1^2$ wherein $L_2$ is the second loudness related value measured in the logarithmic space (e.g. in dB), $L_1$ is the first loudness related value measured in the logarithmic space (e.g. in dB) and A, B and C are real numbers.

Alternatively or in addition, the reversible relation may be segmented into intervals of the first and/or the second loudness related value and a separate reversible relation may be determined for the plurality of intervals. The parameters of the reversible relation may be determined using Segmented Linear Regression. By way of example, the overall reversible relation may be segmented into a plurality of intervals $[L_{1,t-1}, L_{1,t}]$ with $t = 1, \ldots, N_T$, wherein $N_T$ is the total number of intervals or segments ($N_T > 0$). For each of the intervals $[L_{1,t-1}, L_{1,t}]$ a different reversible relation, e.g. a polynomial of first or second order, may be determined. Furthermore, it may be beneficial to impose that the overall reversible relation is continuous at the borders of the plurality of intervals. The step of converting the first loudness related value into a second loudness related value may further comprise the step of offsetting the first loudness related value by a predetermined value if the audio signal is a mono signal. In an embodiment, the reversible relation relates to a stereo audio signal. In such cases, the corresponding reversible relation for a mono audio signal may be obtained by offsetting the first loudness related value by the predetermined value, prior to applying the reversible relation. The predetermined value may be 3 dBFS.

The method for providing loudness data to a media player may further comprise the step of extracting the second loudness related value from the metadata and/or the step of rendering the audio signal using the second loudness related value. The audio signal may be rendered at a target output level. In such cases, the step of rendering may comprise the amplification or the attenuation of the audio signal in accordance to the second loudness related value. In other words, the second loudness related value or a value derived from the target output level and the second loudness related value, e.g. a value corresponding to the difference between the target output level and the second loudness related value, may be applied to the samples of the audio signal.

The method may further comprise the step of converting the second loudness related value into the first loudness related value using the reversible relation. In particular, the inverse of the reversible relation may be used. In such cases, the media player may render the audio file using the first loudness related value. As outlined above, the step of rendering may comprise the step of applying the first loudness related value or a value derived from the first loudness related value to samples of the audio signal. In addition, the step of rendering may comprise the step of controlling the dynamic range of the loudness processed audio signal. Furthermore, the step of rendering may comprise limiting the loudness processed audio signal to avoid clipping.

According to a further aspect, a system configured to provide loudness related data to a media player is described. The system may comprise a loudness encoder configured to provide a first loudness related value associated with an audio signal, wherein the first loudness related value has been determined according to a first procedure. The loudness encoder may be further configured to convert the first loudness related value into a second loudness related value using a model comprising a reversible relation, wherein the second loudness related value is associated with a second procedure for determining loudness related values. In addition, the loudness encoder may be configured to store the second loudness related value in metadata associated with the audio signal.

The system may comprise a transmission medium configured to provide the metadata to the media player. Such transmission medium may be a wireless or a wireline transmission medium. Furthermore, the transmission medium may be a storage medium such as RAM or a compact disk.

The system may comprise a media player configured to extract the second loudness related value from the metadata; and to render the audio signal based on the second loudness related value. In addition, the media player may be configured to convert the second loudness related value into the first loudness related value using the reversible relation; and to render the audio signal using the first loudness related value.

According to another aspect, a loudness encoder is described. The loudness encoder may be configured to provide a first loudness related value associated with an audio signal; wherein the first loudness related value has been determined according to a first procedure; to convert the first loudness related value into a second loudness related value using a model comprising a reversible relation; wherein the second loudness related value is associated with a second procedure for determining loudness related values; and/or to store the second loudness related value in metadata associated with the audio signal.

According to a further aspect, a media player is described. The media player may be configured to extract a second loudness related value from metadata associated with an audio signal; wherein the second loudness related value is associated with a second procedure for determining loudness related values. Furthermore, the media player may be configured to convert the second loudness related value into a first loudness related value using a model comprising a reversible relation; wherein the first loudness related value has been determined according to a first procedure. In addition, the media player may be configured to render the audio signal using the first loudness related value.

According to a further aspect, a method for rendering an audio signal at a media player using a first loudness related value is described. The method may comprise the step of receiving metadata associated with the audio signal at the media player. The method may proceed in extracting a second loudness related value from the metadata associated with the audio signal; wherein the second loudness related value is associated with a second procedure for determining loudness related values. The second loudness related value may be converted into a first loudness related value using a model comprising a reversible relation; wherein the first loudness related value has been determined according to a first procedure. Eventually, the method may comprise the step of rendering the audio signal using the first loudness related value. In an embodiment, the second loudness related value is derived at a corresponding loudness encoder by conversion from the first loudness related value using the reversible relation. In particular, the second loudness related value may be determined from an ITU-R BS.1770 loudness value using the reversible relation. In another embodiment, the second loudness related value may correspond to the loudness related value determined directly using the second procedure. In particular, the second loudness related value may correspond to a Replay Gain adjustment value computed by a legacy device.

According to another aspect, a method for determining a reversible relation for converting a first loudness related value into a second loudness related value is described. The method may comprise the step of determining a plurality of first loudness related values associated with a corresponding plurality of audio signals, wherein the plurality of first loudness related values is determined according to a first procedure. The method may further comprise the step of determining a plurality of second loudness related values associated with the corresponding plurality of audio signals, wherein the plurality of second loudness related values is determined according to a second procedure. In addition, the method may comprise the step of providing a model for the reversible relation comprising a model parameter. In addition, the method may comprise the step of determining the model parameter by fitting the model to the plurality of first and second loudness related values using an appropriate error minimization criterion such as least mean squares error, thereby yielding the reversible relation.

According to a further aspect, a software program adapted for execution on a processor is described. The software program may be further adapted for performing a method according to any of the aspects outlined in the present document when carried out on a computing device.

According to another aspect, a storage medium comprising a software program adapted for execution on a processor is described. The software program may be further adapted for performing a method according to any of the aspects outlined in the present document when carried out on a computing device.

According to a further aspect, a computer program product is described. The computer program product may comprise executable instructions for performing a method according to any of the aspects outlined in the present document when carried out on a computing device.

It should be noted that the methods and systems including their preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

BRIEF DESCRIPTION OF THE DRAWINGS

The invention is explained below in an exemplary manner with reference to the accompanying drawings, wherein

FIG. 2b illustrates the mean BS.1770 loudness and standard deviation for the different genres of the example data base of FIG. 2a;

FIG. 2c illustrates the distribution of year information provided for the example data base of FIG. 2a;

FIG. 2d illustrates the average BS.1770 loudness and standard deviation vs. year information for the example data base of FIG. 2a;

FIG. 2e illustrates the Replay Gain adjustment values vs. BS.1770 loudness values for the example data base of FIG. 2a;

FIG. 2f shows an example histogram for the transcoding error between BS.1770 loudness and Replay Gain loudness for the example data base of FIG. 2a;

FIG. 2g shows modified Replay Gain adjustment values vs. BS.1770 loudness values for the example data base of FIG. 2a;

FIG. 3 is a schematic block diagram of an example decoding device within a media player;

FIG. 4 is a schematic block diagram of an example encoding device at an audio production or transmission site.

DETAILED DESCRIPTION

Figure 1A:
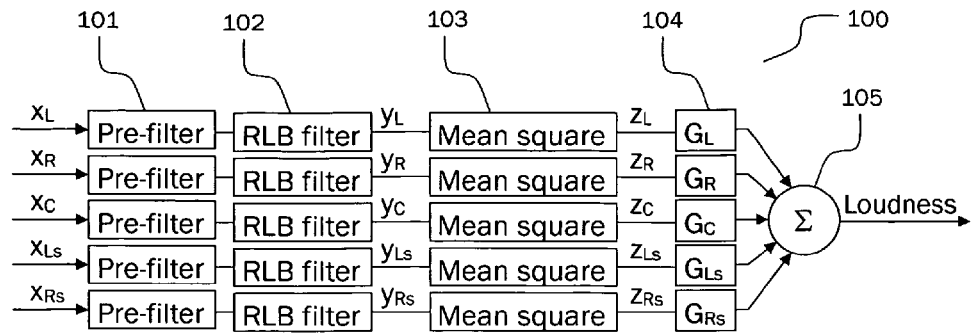
FIG. 1a illustrates an example measurement setup for BS.1770 loudness.

An approach to providing audio output at a constant perceived level is to define a target output level at which the audio content is to be rendered. Such a target output level may e.g. be −11dBFS (decibels relative to Full Scale). In particular, the target output level may depend on the current listening environment. Furthermore, the actual loudness level of the audio content, also referred to as the reference level, may be determined. The loudness level is preferably provided along with the media content, e.g. as metadata provided in conjunction with the media content. In order to render the audio content at the target output level a matching gain value may be applied during playback. The matching gain value may be determined as the difference between the target output level and the actual loudness level.

Furthermore, potential clipping should be taken into account in cases where the content needs to be boosted to match the target output level, i.e. in case a positive matching gain is to be applied. Furthermore, if the actual loudness level or the reference level is provided in metadata which is associated with the media content, the handling of legacy media content, i.e. the handling of media content which does not comprise the required metadata, has to be addressed.

As has already been indicated above, systems for streaming and broadcasting, like e.g. Dolby Digital, typically rely on transmitting metadata which comprises a "dialnorm" value which indicates the loudness level of the current program to the decoding device. The "dialnorm" value may be different for different programs. In view of the fact that the "dialnorm" value or values are determined at the encoder, the content owner is enabled to control the complete signal chain up to the actual decoder. Furthermore, the computational complexity on the decoding device can be reduced, as it is not required to determine loudness values for the current program at the decoder. Instead the loudness values are provided in the metadata associated with the current program.

For file-based systems, i.e. for systems which relate to media files instead of media bitstreams, a loudness value or a reference level typically does not change for a given file. In other words, loudness values are determined on a per file basis. In an embodiment, the loudness levels are encoded into the payload, i.e. the actual media content is modified, in order to meet certain target output levels. On the other hand, media file systems have been designed that rely on a single loudness value per file, wherein the loudness value may be stored as additional metadata associated with the media content. An example for such a media file system is based on the so called "Replay Gain" initiative and the corresponding "Replay Gain" format which is specified on http://www.replaygain.org. The disclosure of this internet site is incorporated by reference in its published version at the priority date of the present document. The Replay Gain format has been implemented on various media players which are thereby enabled to perform loudness adjustments to media files that comprise metadata corresponding to the Replay Gain format.

The Replay Gain format defines a predetermined Replay Gain syntax for specifying a plurality of parameters associated with a particular media file. Possible parameters may be a Replay Gain adjustment value per media track or a Replay gain adjustment value per album of media tracks. The first parameter specifies a loudness value for a media file, whereas the second parameter specifies a common loudness value for an album, i.e. for a set of media tracks. Further parameters may be the Replay Gain Peak signal amplitude per track and/or the Replay Gain Peak signal amplitude per album. These parameters specify the maximum absolute amplitude of a track or an album, respectively.

The Replay Gain initiative also specifies a procedure for determining the above parameters for a particular track or album, i.e. semantics for the parameters are specified. The Replay Gain adjustment values, i.e. the loudness related values, are determined using a procedure outlined on http://www.replaygain.org. The Replay Gain adjustment values are supposed to adjust the music loudness to the loudness of pink noise at −20 dBFS played back over stereo loudspeakers. The associated sound pressure level, i.e. the predetermined target output level, is 83 dB SPL. The Replay Gain Peak signal amplitude is determined by determining the maximum absolute amplitude of the media file. It should be noted, however, that the perceptual motivation of these procedures, in particular the procedure relating to the determination of a loudness value, may be questioned and it is preferable to apply procedures which have been generally accepted to be perceptually meaningful.

As a consequence, there is a problem of defining appropriate perceptually relevant parameters for audio content. In particular, the problem of determining a loudness level of a media file or a group of media files which equally satisfies the perception of different users has to be addressed. As a matter of fact, loudness is a highly subjective quantity and there is often no single loudness level that will satisfy all listeners (or even a single listener) all of the time. A study performed by Dolby Laboratories concluded that even when audio programming has been "normalized" by a group of people "by ear", the "normalized" programs do not completely satisfy a different group of listeners 100 percent of the time. Nevertheless, a method for measuring audio program loudness, as well as true-peak audio level, has been specified as recommendation ITU-R BS.1770. This recommendation is incorporated by reference. The specified method for measuring audio loudness has been widely accepted and it can be used as a common loudness measurement for different sources and formats of multimedia content. As such, it can be ensured that different encoding tools behave consistently. This will increase consumer satisfaction since content from different sources will behave similarly. It should be noted that ITU-R BS.1770 does not define a predetermined target loudness or target output level and it is open to the user to derive an appropriate gain based on the loudness measure. The BS.1770 algorithm has been verified to predict loudness correctly for different content (speech, music and film) and for mono, stereo and 5.0/5.1 multichannel alike. In addition, the computational complexity is low compared to more sophisticated psychoacoustic models (e.g. the Zwicker model) which employ filter bank analysis and model masking.

In summary, the so called Replay Gain initiative specifies a Replay Gain format for associating loudness data with a particular media file. This format has been widely accepted by various media players. The Replay Gain initiative also specifies an algorithm or procedure to compute a Replay Gain adjustment value to normalize loudness across tracks and/or albums. In view of the extensive psychoacoustic and physiological know how which has been taken into account in recommendation BS.1770, it is, however, expected that a higher degree of perceptual satisfaction can be achieved when using the loudness measurement specified in recommendation BS.1770.

Given the considerations above, it is proposed to implement loudness normalization in media players based on the loudness measurement as defined in the ITU-R recommendation BS.1770, and by conveying such loudness values as equivalent or corresponding Replay Gain adjustment values as metadata with media files. In other words, it is proposed to measure loudness based on ITU-R BS.1770. In addition, in order to support existing Replay Gain metadata and maintain consistent leveling with both types of leveling information, a conversion between Replay Gain and ITU-R BS.1770 loudness is described. To achieve this goal both leveling approaches, i.e. Replay Gain and ITU-R BS.1770, are investigated by means of a statistically relevant music data base.

In the following, certain aspects regarding the loudness measurement according to recommendation ITU-R BS.1770 are outlined. FIG. 1a shows a block diagram of the various components of the loudness measurement algorithm 100. The block diagram shows inputs for five main channels (left, centre, right, left surround and right surround); this allows monitoring of media files comprising from one to five channels. For a media file that has less than five channels some inputs would not be used. The low frequency effects (LFE) channel is typically not included in the loudness measurement.

The first stage of the algorithm applies a pre-filtering 101 to the signal as shown in FIG. 2 of ITU-R BS.1770-1. The pre-filtering accounts for the acoustic effects of the listener's head, where the head is modeled as a rigid sphere. The pre-filter 101 is defined by the filter shown in FIG. 3 of ITU-R BS.1770-1 with the coefficients specified in Table 1 of ITU-R BS.1770-1. The second stage 102 of the algorithm applies the RLB weighting curve, which consists of a high-pass filter as shown in FIG. 4 of ITU-R BS.1770-1, wherein the RLB weighting curve is specified as a second order filter as shown in FIG. 3 of ITU-R BS.1770-1, with the coefficients specified in Table 2 of ITU-R BS.1770-1.

Subsequently, the mean-square energy of each channel in a measurement interval T is measured using Equation (1) of ITU-R BS.1770-1 in unit 103. Eventually, the energy values are weighted (reference sign 104) and the weighted energy values for the different channels are summed up (reference sign 105) to yield the loudness value of the media file in the respective measurement interval T. The weighting 104 is referred to as K weighting. Furthermore, the loudness determination may comprise an offsetting of the sum of the weighted energy values. Therefore, the loudness value determined according to ITU-R BS.1770-1 may be referred to as Loudness, K weighted, relative to normal Full Scale (LKFS).

In summary, ITU-R BS.1770 recommends the following steps to determine BS.1770 loudness: (1) Filter all channels with the Revised Low Frequency B curve (RLB) and in serial with a spherical head approximation filter (units 101 and 102); (2) Compute long term power for every channel relative to full scale (unit 103); (3) If present, increase surround channel powers by factor 1.41 (1.5 dB) (unit 104); (4) Add all channel powers, convert into dB and add a calibration level of 0.691 dB (unit 105). The result is the loudness given in LKFS. The calibration level ensures that a mono full scale sine wave is assigned a loudness of −3.01 LKFS.

The algorithm for the determination of gain values used in the Replay Gain initiative differs from the loudness measurement according to ITU-R BS.1770-1. The gain values are determined using a pre-processing with an average equal loudness filter (or more precisely an IIR-filter (Infinite Impulse Response-filter) approximation to the inverse average loudness curve as outlined at http://www.replaygain.org/). Subsequently, RMS (root mean square) energy values are calculated for 50 ms time intervals of the respective audio signal. The different RMS energies are sorted into numerical order and only the 5% time intervals having the highest RMS energies are considered for estimating the overall perceived loudness of the audio signal. Eventually, the Replay Gain adjustment value of the audio file may be determined by calibrating the Replay Gain adjustment value such that the audio signal which is rendered with the Replay Gain adjustment value is rendered at an average replay level of 83 dB SPL (sound pressure level) according to a pink noise reference signal at −20 dBFS played back over two speakers. This calibration is performed in accordance to the calibration defined in the SMPTE recommendation.

In summary, for the determination of the Replay Gain adjustment values the following steps are proposed: (1) Filter all channels with an average equal loudness filter; (2) Compute powers relative to full scale for non-overlapping blocks of 50 ms lengths and average over channels; (3) Compute the block power which is exceeded in 5% of all blocks per track and derive loudness by converting into dB. Eventually, the Replay Gain adjustment values are computed as the difference between the target loudness and the measured loudness where the target loudness is based on the pink noise reference signal [−25.5 dB-loudness]. As such, a gain value is obtained as the Replay Gain adjustment value.

Figure 1B:
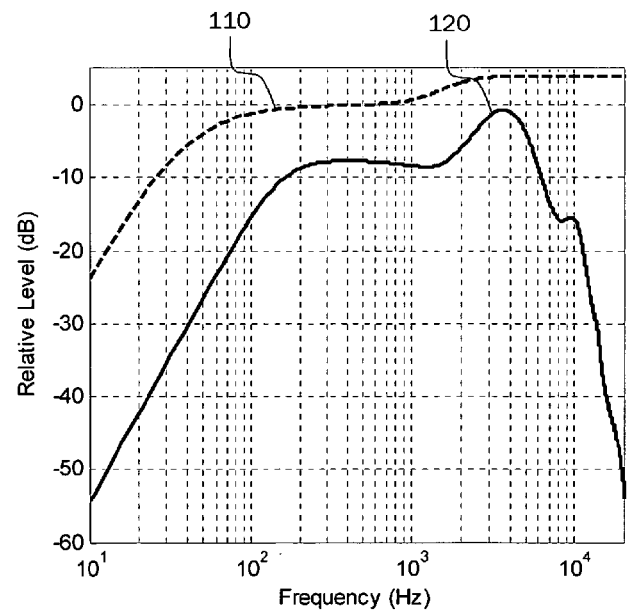
FIG. 1b illustrates example frequency weighting curves applied for Replay Gain and ITU-R BS.1770.

Both leveling approaches, i.e. ITU-R BS.1770 and Replay Gain, measure a frequency weighted power. The main differences between both leveling approaches are the filter characteristics and the statistical power analysis from which the loudness is derived. While ITU-R BS.1770 applies a frequency weighting curve 110 having a high-pass filter characteristic, the Replay Gain frequency weighting curve 120 has a band-pass filter characteristic as shown in FIG. 1b.

In ITU-R BS.1770 energy is averaged over the complete music track potentially including silence which typically does not contribute to the subjective loudness. In the investigations performed by the inventors, silence periods are preferably excluded from the measurement. As such, a modified ITU-R BS.1770 algorithm may be used. For this purpose, silence periods may be detected using one or more criteria. According to a first criterion, the (absolute) peak level of an audio signal does not exceed an (absolute) peak threshold during a silence period of the audio signal. In an embodiment, such a peak threshold may be −60 dBFS or −70 dBFS. According to a further criterion, the energy of the audio signal may not exceed an energy threshold during a silence period of the audio signal. In an embodiment, such an energy threshold may be −70 LKFS. A further criterion may be a minimum and/or maximum duration of a silence period. As such, a silence period may be detected if the first and/or the second criterion are met for a minimum and/or maximum duration of the audio signal. Typical minimum durations may be 200 msec or 1 sec, wherein typical maximum durations may be 400 msec or 10 sec.

As such, the first or the second procedure for determining a loudness related value may be a modified ITU-R BS.1770 algorithm which excludes silence periods of the audio signal for the determination of the loudness related value. The silence periods of the audio signal may be determined as outlined above. The exclusion of silence periods may also be referred to as silence gating, wherein the time interval given by the minimum duration and the maximum duration of the silence periods may be referred to as a silence gate. As such, the modified ITU-R BS.1770 algorithm may also be referred to as the ITU-R BS.1770 algorithm using silence gating. In more general terms, it may be stated that a procedure for determining a loudness related value may or may not consider silence gating.

However since music data usually does not exhibit a significant amount of silence the impact of silence is limited. Replay Gain, on the other hand, measures the frame power that is exceeded by only 5% of all frame powers which is near the absolute maximum frame power, i.e. Replay Gain determines a near maximum power for a particular music file.

In view of the fact that Replay Gain adjustment values and the ITU-R BS.1770 loudness values are determined using different procedures or algorithms, the relationship between both values for a particular media file is highly complex. Nevertheless, based on the analysis of the inventors outlined in this document, a meaningful relationship between both procedures and their resulting loudness related values may be determined. As will be shown, the near maximum power measurement applied in Replay Gain and the long term power applied in ITU-R BS.1770 have a significant impact on the relationship between the Replay Gain adjustment values and the BS.1770 loudness values. Furthermore, it will be shown that the relationship between the results from the different power measurement schemes depends on the dynamic range of the particular music file.

As indicated above, it is suggested to convey loudness values according to ITU-R BS.1770-1 as equivalent or corresponding Replay Gain adjustment values. In this context, it is suggested to match the Replay Gain semantics to BS.1770 loudness results based on a statistically derived relation, e.g. a linear equation. This may be achieved by determining BS.1770 loudness values and Replay Gain adjustment values for a statistically relevant number of sound or audio files (e.g. in mp3 and m4a format). Subsequently, a deterministic and preferably invertible relationship between the BS.1770 loudness values and Replay Gain adjustment values may be determined. Such a relation may be a polynomial, e.g. a polynomial of first or second order, which is matched to the plurality of pairs of BS.1770 loudness values and Replay Gain adjustment values using an appropriate error minimization criterion. In an embodiment, the relation may be a linear equation in the logarithmic space which is determined using a least mean square error criterion or other error criteria such as a total least square error criterion or a least absolute deviation error criterion. Linear regression techniques may be used to determine the relation.

Figure 2A:
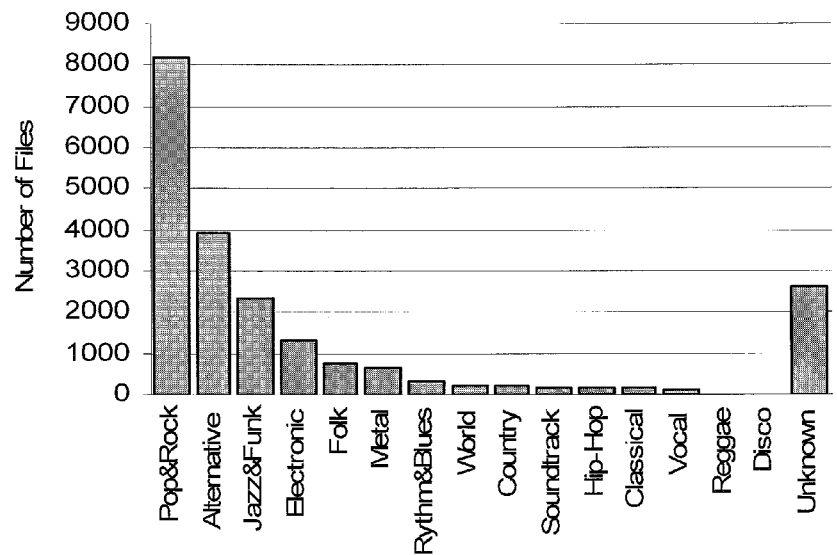
FIG. 2a illustrates the distribution of genres of an example data base of music files.

In an embodiment, a statistically relevant music data base consists of 21220 stereo files originating from different private music collections. Compression formats are mp3 and AAC at various bitrates and sample rates between 32 and 48 kHz. The Replay Gain adjustment values are calculated for all files. Loudness according to ITU-R BS.1770 is computed without considering silence periods, wherein silence is identified when the maximum peak level relative to full scale remains below −60 dBFS for more than one second. On average only 0.6% of the audio track duration were identified as silence, indicating that the effect of silence is relatively small. Files having low loudness values seem to have a higher degree of silence periods than louder files (0.3% silence periods at −5 LKFS to 1.2% silence periods at −30 LKFS). FIG. 2a shows the distribution of music genres in the example data base according to ID3 metadata.

Figure 2B:
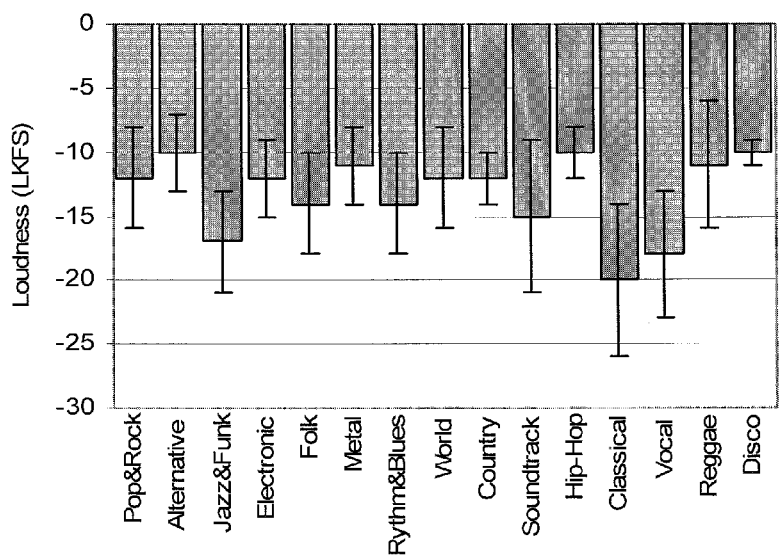
Figure 2C:
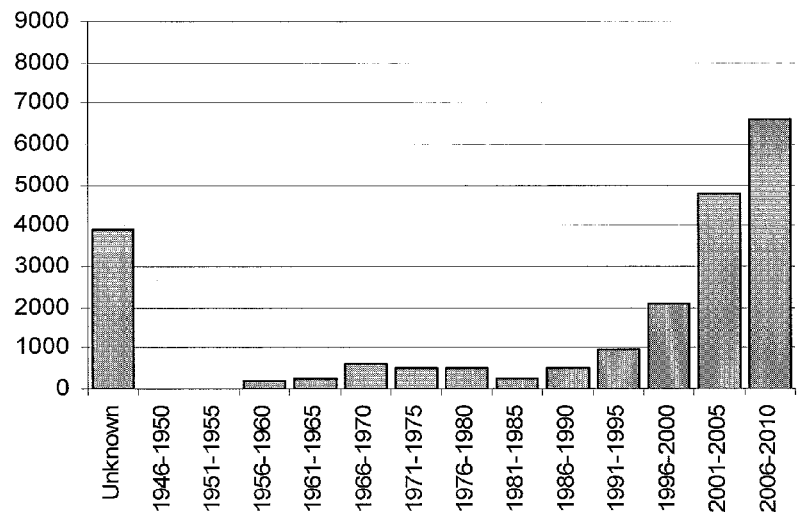
Figure 2D:
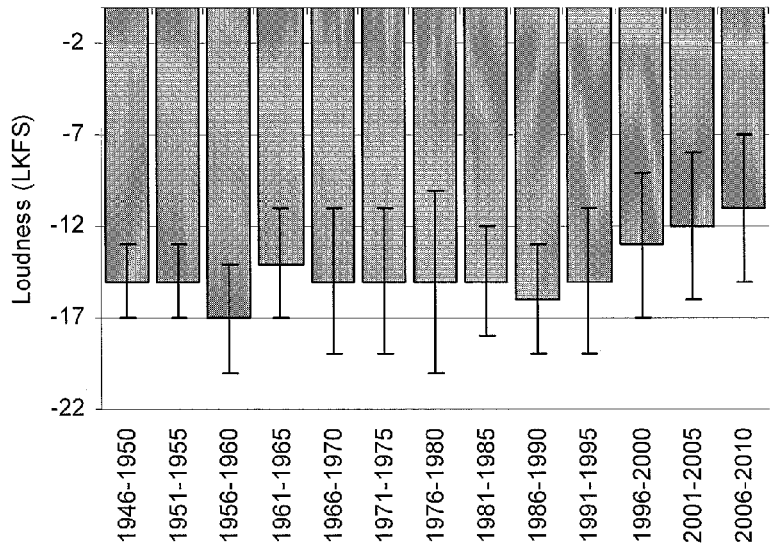

Based on the above example music data base, it has been found that there is in general moderate loudness variation in the range of 5-10 LKFS between genres. However Classical music and Spoken content have especially low loudness compared to other genres as can be seen in FIG. 2b. According to ID3 metadata about half of all the music files are not older than 2001 as can be seen in FIG. 2c. As has already been indicated above, there is a tendency for increasing loudness from the early 1990's on until today. This can be seen in FIG. 2d. If restricting the analysis to very recent music files of 2009, the mean loudness is at −8.5 LKFS.

Figure 2E:
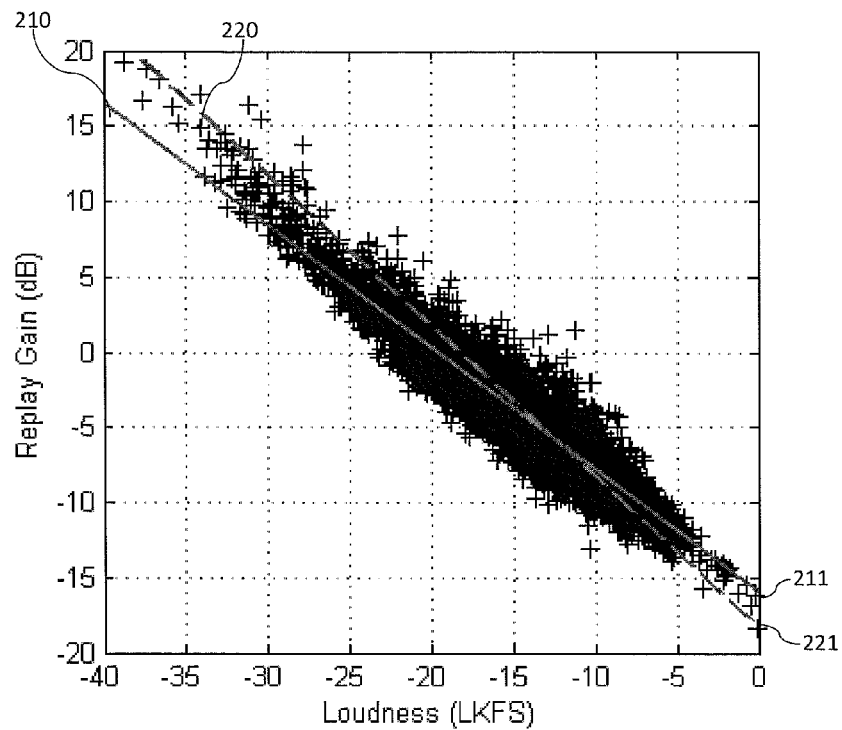

FIG. 2e shows a graph where the pairs of Replay Gain adjustment value and BS.1770 loudness value have been plotted for the above mentioned music data base. The line 210 has been obtained using a least squares straight line (first order polynomial) fit to the plurality of data pairs. The line has a slope of −0.81 in the logarithmic space (dB). A slope which is different from −1.0 in the logarithmic space indicates a non-linear relationship between both underlying power measures. The dashed line 220 represents the least squares solution when the slope is restricted to −1.0 in the logarithmic space so that the relation between the different power measures is modeled linearly by a constant factor.

Linear regression may be applied to determine a relationship which may be used to convert a Replay Gain adjustment value into a ITU-R BS.1770 loudness value and vice versa. The dashed line 220 represents the straight line fit where the slope is restricted to be −1.0 in the dB space with an offset of −18.3 dB (reference numeral 221). Without this restriction the optimum slope in the dB space is −0.81 and the optimum offset −16.0 dB as represented by the solid line 210 (reference numeral 211).

In other words, it is suggested to determine an estimate of the Replay Gain adjustment value using the formula:

$$\text{Replay Gain}' = -16.00 - 0.812 * BS1770, \quad (1)$$

wherein Replay Gain' is the estimate of the Replay Gain adjustment value Replay Gain measured in dB, and BS1770 is the BS.1770 loudness value measured in dB (or LKFS), for the same media file. Formula (1) has been derived by applying a mean square error criterion and a linear relation in the dB space on a statistically relevant plurality of pairs of BS.1770 loudness values and Replay Gain adjustment values, wherein each pair of values is determined from the same media file.

Alternatively, the slope may be restricted to −1.0 in the dB space. In such a case, an estimate for the Replay Gain adjustment value may be determined using the formula:

$$\text{Replay Gain}' = -18.3 - 1.0 * BS1770, \quad (2).$$

It should be noted that in an alternative embodiment, the slope may be restricted to −1.0 in the dB space and the offset of the first order polynomial may be fitted in the dB-space with the predefined slope of −1.0 so that the median of the Replay Gain estimation error is 0.0 dB for the underlying data base. By using this error criteria, a reversible relation may be determined such that the number of measured data points with positive estimation error equals the number of data points with negative estimation error. By using this median based error criterion, an offset of −18.1 may be obtained for the investigated data base, i.e.

Replay Gain'=−18.1−1.0*$BS1770$.

It should be noted that in some instances, it may be advantageous to modify the preceding formula to use an offset of −18.0 rather than −18.1, i.e.

Replay Gain'=−18.0−1.0*$BS1770$.

The estimation error of the relation between BS.1770 loudness values and Replay Gain adjustment values is defined as Error=Replay Gain'−Replay Gain (dB). Statistical characteristics of the absolute value of this Error for the above mentioned measurements are provided in Table 1.

TABLE 1

|  | Formula (1) | Formula (2) |
|---|---|---|
| RMS | 1.04 | 1.32 |
| Mean | 0.78 | 1.04 |
| Max95% | 2.11 | 2.66 |
| Max75% | 1.08 | 1.45 |

Figure 2F:
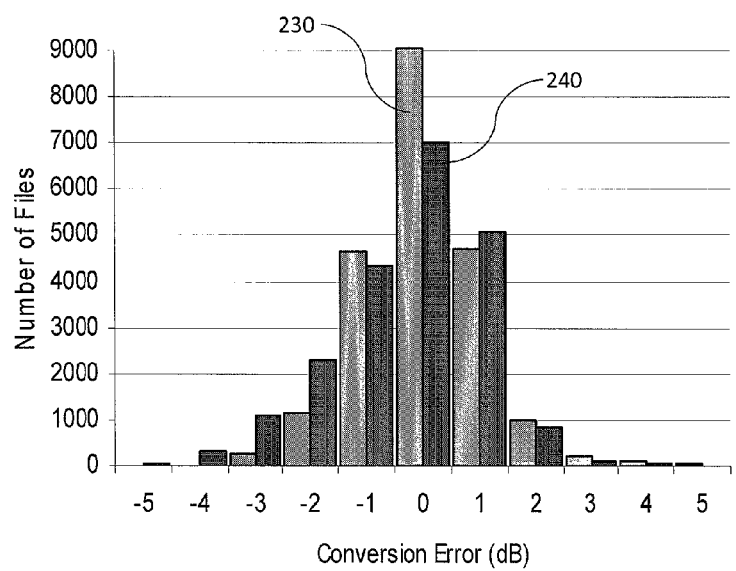

FIG. 2f shows a corresponding error histogram for the error corresponding to the difference between the estimated and the actual Replay Gain adjustment value. The histogram 230 corresponds to the estimates obtained from formula (1) and the histogram 240 corresponds to the estimates obtained from formula (2).

It should be noted that the above formula (1) and (2) have been derived for stereo audio content. However, it has been observed that for mono content ITU-R BS.1770 loudness and Replay Gain adjustment values behave differently. While the determination of Replay Gain adjustment values yields the same result for a mono signal and an corresponding dual mono signal, the determination of ITU-R BS.1770 loudness of the dual mono signal is 3 dB higher than that of the corresponding mono signal.

Therefore, the above conversion rules could be adapted for general mono or stereo content to:

Replay Gain'=−16.00−0.812*($BS1770+x$),                 (1')

Replay Gain'=−18.3−1.0*($BS1770+x$),                 (2')

wherein x=3 dBFS for mono content and x=0 dBFS otherwise.

The observation that the optimum slope is unequal to −1.0 indicates a dependency of the relationship between the Replay Gain adjustment value and the BS.1770 loudness value on the actual loudness level. This can be explained by the different statistical power analyses performed by both procedures. The near maximum frame power determined by Replay Gain does not change in the same way as does the long term power determined by ITU-R BS.1770. This is particularly true for higher loudness values when the dynamic range is being reduced. Therefore an improved fitting by a $2^{nd}$ order polynomial may be achieved. The $2^{nd}$ order polynomial may have a slope of −1.0 for low loudness and a reduced slope (greater than −1.0) for moderate and higher loudness values (e.g. >−25 LKFS). However using a slope of −1.0 with an optimum level offset (of −18.3 dB) may already be sufficient for many music files.

Figure 2G:
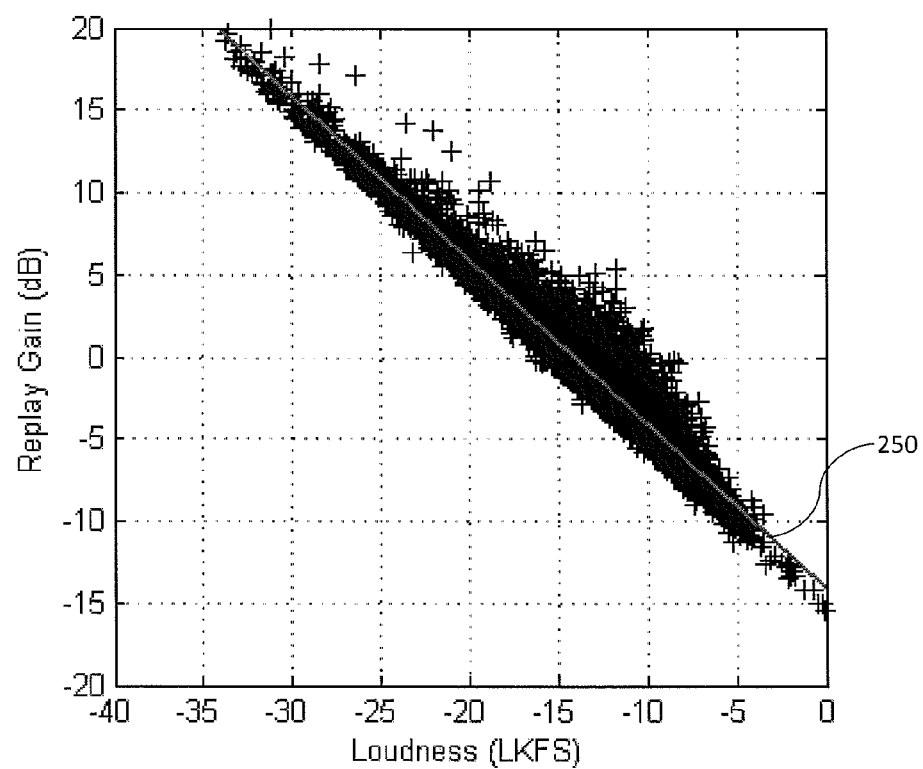

The fact that the non-linear relationship between the power measures obtained when using the Replay Gain procedure and when using the ITU-R BS.1770 procedure is mainly due to the different statistical power analysis schemes used in both procedures can be seen in FIG. 2g. For this purpose, the near maximum frame power measurement in Replay Gain is replaced by the long term power measurement used in ITU-R BS.1770. The modified Replay Gain adjustment values are plotted against the corresponding BS.1770 loudness values and it can be seen from FIG. 2g that a line 250 having a slope of −1.0 fits well the plurality of data points/pairs.

Using the above conversion formula (1) or (2), loudness measurements may be performed according to BS.1770 and subsequently converted into equivalent Replay Gain adjustment values which may be stored and/or transmitted in accordance to the Replay Gain format. Depending on the capabilities of the audio decoder on the electronic device, the loudness may be normalized in accordance to the Replay Gain specification. In other words, if the media player is Replay Gain compatible, the media file may be rendered at the Replay Gain initiative target output level using the Replay Gain adjustment value.

On the other hand, if the audio decoder is configured to perform loudness normalization in accordance to the BS.1770, the BS.1770 loudness values may be re-calculated from the equivalent Replay Gain adjustment values using the inverse of formula (1) or (2). In other words, the media player may determine the BS.1770 loudness values from the Replay Gain adjustment values and render the media files at the target output level by determining the appropriate gain in accordance to the BS.1770 standard. In view of the fact that the BS.1770 loudness values are normalized to Full Scale (FS), the gain to be applied for achieving a target output level measured in FS may be determined as the difference between the target output level and the BS.1770 loudness value.

It should be noted that due to the reversibility of the conversion formula (1) or (2), an original BS.1770 loudness value can be re-calculated from an equivalent Replay Gain adjustment value without loss of loudness information. This is the case, if the Replay Gain adjustment value was derived from the ITU loudness by means of the conversion formula (1) or (2).

In the following, the aspect of storing the Replay Gain parameters in accordance to Replay Gain syntax is considered. As outlined above, the Replay Gain format typically comprises two types of parameters relating to the media content, a "Replay Gain peak signal amplitude" and a "Replay Gain adjustment value". These parameters can be calculated on a track-by-track basis, or on an album-by-album basis. Track-based values are more suited for use cases and playlists where tracks from different albums are mixed. Album-based values are more suited for use cases where all tracks of an album are played consecutively. The "Replay Gain peak signal amplitude" indicates the maximum absolute amplitude of the audio signal and may be used to prevent clipping at the media player. In an embodiment, the "true-peak audio level" value determined according to the ITU-R BS.1770-1 recommendation may be transmitted as the "Replay Gain peak signal amplitude" parameter.

In addition, to the parameters mentioned above, the Replay Gain format allows the specification of the originator of the Replay Gain parameters. Possible values of such originator of Replay Gain parameters may be e.g. the engineer, artist, producer or user.

The above Replay Gain parameters may be stored using the syntax described in the following. In an embodiment, media content stored in files which are compliant to the MPEG-4 file standard may preferably use iTunes-style metadata. Other formats may store the Replay Gain parameters in ID3v2 tags specified in the ID3v2 specification which is incorporated by reference. A syntax for both cases is outlined below:

1) Replay Gain Parameters in iTunes-style Metadata

Replay Gain parameters may be added as an extension box of type '- - -', conforming to standard iTunes-style metadata. A 'mean' box may be present within the '- - -' box and comprise the meaning "org.hydrogenaudio.replaygain" as specified on http://www.replaygain.org. A 'name' box may be present within the '- - -' box and comprise the name of the value:replaygain_track_gain; replaygain_track_peak; replaygain_album_gain; and/or replaygain_album_peak.

A 'data' box may be present within the '- - -' box and comprise the value in the following formats:

The gain adjustment values are preferably written as a dB floating-point value with 2 decimal places and a leading –/+. (e.g. "–4.65 dB").

The peak signal amplitude is preferably written as a floating-point value (e.g. "0.860931396"). The peak signal amplitude may be higher than 1.0.

Media players should preferably match only on the value in the 'name' box and ignore the value in the 'mean' box for compatibility.

Additional iTunes-style metadata for the Replay Gain originator code may be defined: The Replay Gain may include "originator code" information. For this purpose, a 'mean' box may be present within the '- - -' box and contain the meaning "org.hydrogenaudio.replaygain" in accordance to http://www.replaygain.org. A 'name' box may be present within the '- - -' box and contain the name "replaygain_originator_code". The following originator codes may be used: 000=Replay Gain unspecified; 001=Replay Gain pre-set by artist/producer/mastering engineer; 010=Replay Gain set by user; and/or 011=Replay Gain determined automatically.

Furthermore, the 'data' box may comprise a text string representing the concatenation of the 3-bit originator codes for the ReplayGain values in the following order: replaygain_track_gain; replaygain_track_peak; replaygain_album_gain; and/or replaygain_album_peak. For example, "011011000000" may map to automatically generated values for track gain and peak and unspecified values for album gain and peak.

At a minimum, a file with Replay Gain metadata should include one of a track gain value or an album gain value.

2) Replay Gain in ID3v2 Tags

Replay Gain values may be stored in 'TXXX' fields which follow the following syntax:

TABLE 2

| <Header for 'User defined text information frame', ID: "TXXX"> |
| Text encoding $xx |
| Description <string according to encoding> $00 (00) |
| Value <string according to encoding> |

Each Replay Gain parameter may be contained in its own specific 'TXXX' element. To distinguish parameters, the "Description" string may take the same values as written in the iTunes 'name' box (see above), i.e. notably replaygain_track_gain; replaygain_track_peak; replaygain_album_gain; replaygain_album_peak; and/or replaygain_originator_code. The parameter value corresponding to these parameter descriptions may be stored in the "Value" field. It may use the same format as described in the iTunes section above.

In a preferred embodiment using formula (1), the Replay Gain adjustments shall be between –16 dB and +9 dB (corresponding to a range of loudness values from 0 to –31.25 dBFS). Values outside this range shall be clamped to –16 dB and +9 dB. In another embodiment using formula (2), the Replay Gain adjustment values corresponding to the ITU-R BS.1770 loudness values of 0 dBFS and –31.25 dBFS can be taken from graph 220 in FIG. 2e.

In the following, different aspects regarding an example playback system which supports the proposed method for loudness normalization are described. In particular, these aspects relate to the desired target output level, the controlling of the dynamic range, and the handling of multimedia files which do not comprise loudness metadata.

Portable media players, e.g. mobile phones, dedicated personal music players, or laptops, often need to support different listening environments. Examples for listening environments may be an environment using built-in speakers, an environment using headphone output, and/or a line output used in combination with an analog or digital cradle which may support multi-channel output.

Depending on the selected listening environment, appropriate target output levels may need to be selected. By way of example, for the latter use case using a cradle which may connect the device to Hifi-equipment, a lower target level of –31 dBFS as specified for example in "line mode" for Dolby Digital is most appropriate, thus enabling full dynamic range capabilities.

Furthermore, the portable media player should be able to control the dynamic range in accordance with the applied loudness normalization. Given that the lowest supported loudness value is –31 dBFS, all target output levels above –31 dBFS should support clipping prevention through dynamic range control. I.e. if an audio file having a loudness value or reference level of –31 dBFS is to be rendered at a target output level of more than –31 dBFS, a positive matching gain has to be applied which may cause the amplified audio signal to clip. Hence, portable media players should at least provide a limiter in order to prevent such possible clipping. Formats that support metadata for dynamic range control such as Dolby Digital can also apply such metadata prior to the signal being fed into the limiter. For example, a Dolby Digital decoder operating in RF-mode, which has a target level of –20 dBFS, will require an additional boost of 9 dB followed by a limiter to achieve a target level of –11 dBFS without clipping artifacts. By way of example, a look-ahead limiter with signal-dependent attack and release times could be used, which is able to prevent clipping even for critical (e.g. dynamic) content without any audible artifacts.

In addition, a portable media player should be able to handle multimedia files which do not comprise loudness related metadata. When preparing for playback of a file, a media player may first check whether or not a replay gain value is available. In cases where a complete album is being played back, the album-gain may be preferred over the track-gain. Otherwise, the use of the track-gain may be set as a default. In cases where no Replay Gain adjustment value is available, the system may check for the presence of a format-dependent loudness value such as the "dialnorm" parameter in Dolby Digital or the program reference level in MPEG AAC. In such cases, these format-dependent loudness values may be used. If neither Replay Gain adjustment values nor format-dependent loudness values are available, a default loudness value may be used by the portable media player. By way of example, a default loudness value, i.e. default Replay Gain adjustment value, of –11 dBFS for stereo music content and –27 dBFS for audio/video and multi-channel content may be used. These default loudness values have been determined in the above statistical measurements on a statistically relevant number of music files.

In an embodiment, a target output level of –11 dBFS (optionally –8 or –14 dBFS) is set and the gains for setting this target output level are determined based on the loudness values or reference levels provided along with the media files. The dynamic range of the amplified media files is controlled either with single-sided algorithms or by combining a single-sided limiter with dynamic range control possibly derived from other available metadata.

In order to further illustrate the implementation of a media player which applies loudness values in accordance to the methods outlined in the present document, an example pseudo-code implementation of the methods is provided in Table 3.

TABLE 3

```
// Determine target output level:
Switch ( currentListeningEnvironment( ) ) {
    Case BuiltInSpeaker:
        TargetLevel = -8; //dBFS
        break;
    Case LineOut:
        TargetLevel = -31; //dBFS
        break;
    Default:
        TargetLevel = -11; //dBFS;
        // -14 for high-end phones with good amplifiers
        break;
}
// Determine reference level:
If ( ReplayGainPresent( ) ) {
    Switch ( currentPlaybackMode( ) ) {
        Case albumPlayback:
            If ( albumGainPresent( ) ) {
                ReplayGain = getAlbumGain( );
            } else {
                ReplayGain = getTrackGain( );
            }
            Break;
        default:
            If ( trackGainPresent( ) ) {
                ReplayGain = getTrackGain( );
            } else {
                ReplayGain = getAlbumGain( );
            }
            Break;
    }
    ReferenceLevel =
        (ReplayGain + 16) / -0.8;
    // conversion to BS.1770 loudness value
} else {
    If ( LevelInfoInPayload( ) )
        ReferenceLevel =
            getLevelInfoFromPayload( );
    } else {
        // Default levels
        Switch ( currentMusicFormat ) {
            Case StereoMusic:
                ReferenceLevel = -11; //dBFS
                Break;
            default:
                ReferenceLevel = -27; //dBFS
                Break;
        }
    }
}
// Apply dynamic range compression, if available
If ( metadataAvailable( ) &&
        TargetLevel >= -20) {
    applyMetadata(RF_MODE);
    // e.g. Dolby Digital
    ReferenceLevel = -20; //dBFS
}
// Apply final gain/limiter
Gain = TargetLevel - ReferenceLevel;
If (Gain > 0){
    applyLimiterAndGain( ) ;
} else {
    applyGain( );
}
```

The receiver/decoding device 10 of an example media player is illustrated in FIG. 3. The device 10 receives an encoded input signal from the signal path or transmission medium 11, applies suitable processes in the deformatter 12 to extract encoded audio information and associated metadata from the input signal, passes the encoded audio information to the decoder 14 and passes the metadata along the signal path 13. The encoded audio information may include encoded subband signals representing spectral content of the audio signal and the metadata may specify loudness gain values and other parameters that specify dynamic range compression according to a dynamic range compression profile. The term "dynamic range compression profile" refers to features such as (loudness) gain factors, compression attack times and compression release times that define the operational characteristics of a dynamic range compressor. The decoder 14 applies a decoding process to the encoded audio information to obtain decoded subband signals, which are passed to the dynamic range control 16. The operation and functions of the decoding process may be adapted in response to decoding-control parameters received from the signal path 13. Examples of decoding-control parameters that may be used to adapt the operation and functions of the decoding process are parameters that identify the number and the configuration of the audio channels represented by the encoded audio information.

The dynamic range control 16 optionally adjusts the dynamic range of the decoded audio information. This adjustment may be turned on or off and adapted in response to metadata received from the signal path 13 and/or from control signals that may be provided in response to input from a listener. For example, a control signal may be provided in response to a listener operating a switch or selecting an operating option for the device 10. In implementations that conform to the ATSC Standard, the MPEG-2 AAC standard or the MPEG-4 Audio standard, for example, the encoded input signal includes encoded audio information arranged in a sequence of segments or frames. Each frame contains encoded subband signals representing spectral components of an audio signal with its full dynamic range. The dynamic range control 16 may take no action, which allows the audio signal to be played back with a maximum amount of dynamic range, or it may modify the decoded subband signals to compress the dynamic range by varying degrees. The synthesis filter bank 18 applies a bank of synthesis filters to the decoded subband signals, which may have been adjusted by the dynamic range control 16, and provides at its output a time-domain audio signal that may be a digital or an analog signal.

The gain-limiter 20 is used in some implementations to adjust the amplitude of the time-domain audio signal. The output of the gain-limiter 20 is passed along the path 21 for subsequent presentation by an acoustic transducer.

FIG. 4 is a schematic block diagram of an example encoder/transmitter device 30 at an audio content production or transmission site that may incorporate various aspects outlined in the present document. The device 30 receives an audio input signal from the signal path 31. The device 30 applies a bank of analysis filters to the audio signal to obtain subband signals in either a frequency-domain representation of the input audio signal or a set of bandwidth-limited signals representing the input audio signal. The metadata calculator 34 analyzes the audio input signal and/or one or more signals derived from the audio input signal such as a modified version of the audio input signal or the subband signals from the analysis filter bank 32 to calculate metadata that specify values for a variety of parameters including encoding-control parameters, one or more decoding-control parameters and one or more parameters that specify dynamic range compression according to a dynamic range compression profile. The metadata calculator 34 may analyze time-domain signals, frequency-domain signals, or a combination of time-domain and frequency-domain signals. The calculations performed by the metadata calculator 34 may also be adapted in response to one or more metadata parameters received from path 33. The encoder 36 applies an encoding process to the output of the analysis filter bank 32 to obtain encoded audio information including encoded subband signals, which is passed to the formatter 38. The encoding process may be adapted in response to the encoding-control parameters received from the path 33. The encoding process may also generate other decoding-control parameters along the path 33 for use by processes performed in the device 10 to decode the encoded audio information. The formatter 38 assembles the encoded audio information and at least some of the metadata including the one or more decoding-control parameters and the one or more parameters that specify dynamic range compression (in particular the loudness gain values) into an encoded output signal having a format that is suitable for transmission or storage.

In implementations that conform to the ATSC Standard, the MPEG-2 AAC standard or the MPEG-4 Audio standard, for example, the encoded output signal includes encoded audio information arranged in a sequence of segments or frames. Each frame contains encoded subband signals representing spectral components of an audio signal with its full dynamic range and having amplitudes for playback at a reference reproduction level.

Figure 5:
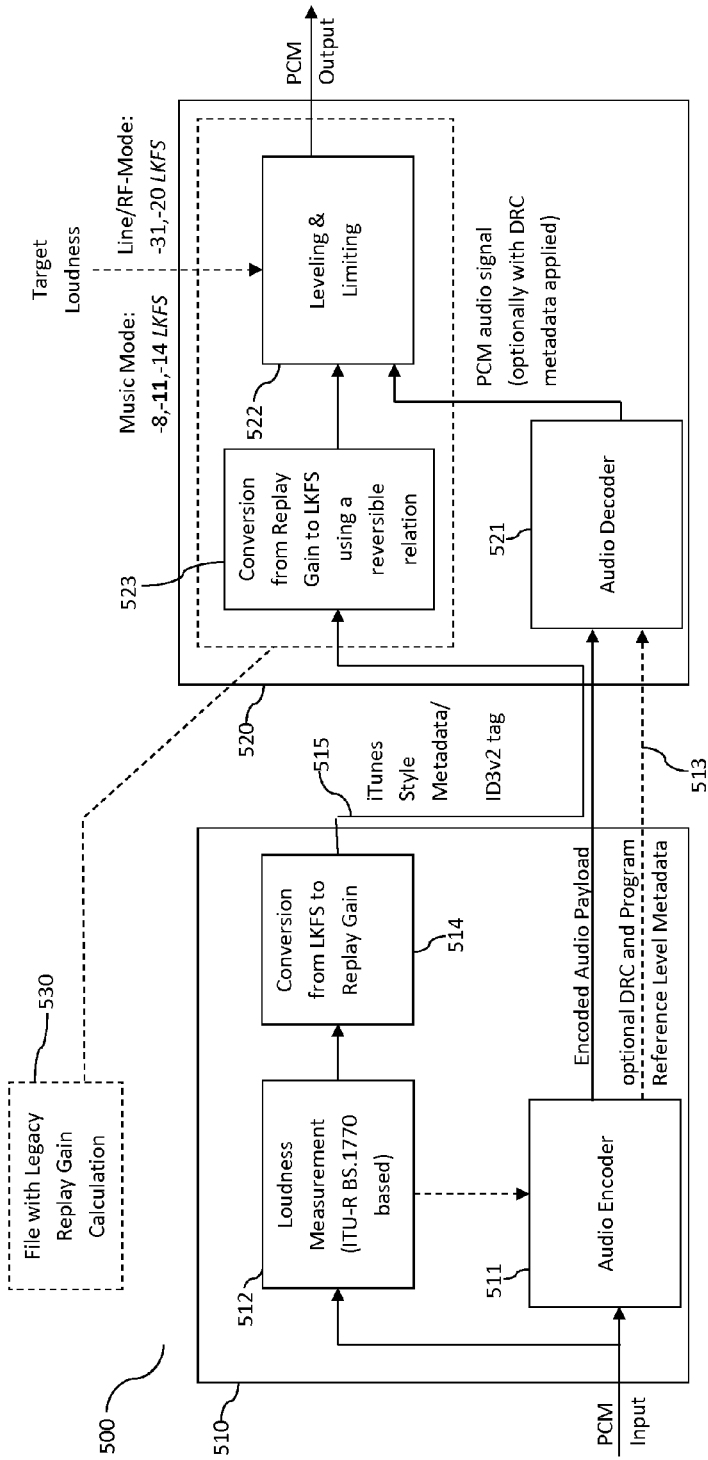
FIG. 5 illustrates a block diagram of an example encoding and decoding system.

FIG. 5 illustrates an example overall system 500 comprising an audio encoder 511 and an audio decoder 521, as well as optional Dynamic Range Control and Loudness Adjustment 522 according to Line/RF- or Music Mode. The audio encoder 511 may be a Dolby Digital, Dolby Digital Plus, Dolby Pulse, HE-AAC, mp3, or any other encoder. Loudness measurements shall be performed based on ITU-R BS.1770 as indicated by unit 512. The measured or provided BS.1770 loudness is either directly transmitted in the bitstream as "dialnorm" metadata in Dolby Digital/Dolby Digital Plus or as "prog ref level" in Dolby Pulse or MPEG HE-AAC. This is indicated by the dotted arrow 513. Alternatively or in addition, the loudness may be conveyed in one or more ID3v2 tags or iTunes style metadata by means of a conversion to Replay Gain. Such conversion may be performed in loudness conversion unit 514. The ID3v2 tags or iTunes style metadata 515 are provided from the encoding side 510 to the decoding side 520. It should be noted that a Dolby Pulse Encoder comprises the processing blocks as indicated by unit 510 and that a Dolby Pulse Decoder comprises the processing blocks as indicated by unit 520. At the decoding side 520 Replay Gain metadata is converted into ITU-R BS.1770 loudness using the inverse conversion unit 523. The conversion unit 514 and the inverse conversion unit 523 typically apply a reversible relation as outlined in the present document. In an embodiment, the Replay Gain metadata received at the decoding side 520 may be original Replay Gain metadata 530 either computed at the encoder side 510 as shown above or as a post-processing at the decoder or player side 520, the loudness value which is determined in the inverse conversion unit 523 typically is an approximation to the true ITU-BS.1770 loudness. It should be noted that optionally, loudness information may be used at the encoder side 510 to compute Dynamic Range Control (DRC) metadadata. This DRC metadata may be provided to the decoder side 520 via link 513 and it may be used in the decoding unit 521.

In the present document, a method and system for loudness normalization in portable media players has been described. The method and system rely on the combination of the standardized BS.1770 loudness measurement and the Replay Gain containers used in various portable media players. A formula has been determined from statistical measurements which can be used to convert BS.1770 loudness values into Replay Gain values and vice versa, on the encode side, as well as on the decode side. As such, a loudness normalization according to BS.1770 can be achieved which is fully compatible with current dialnorm-based leveling. The system results in statistically optimal loudness normalization even for mixed content, e.g. content that was partially analyzed with BS.1770 and partially analyzed by the Replay Gain algorithm. The method and system can be implemented with low computational complexity, in particular at the portable media player.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

The methods and systems described in the present document may be implemented as software, firmware and/or hardware. Certain components may e.g. be implemented as software running on a digital signal processor or microprocessor. Other components may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the interne. Typical devices making use of the methods described in the present document are media players which decode audio signals. On the encoding side, the systems and methods may be used in broadcasting stations and at multimedia production sites.

The invention claimed is:

1. A method for providing perceptually relevant loudness related values for loudness normalization to a media player, the method comprising:
   providing a first loudness related value associated with an audio signal; wherein the first loudness related value has been determined according to a first procedure; wherein the first procedure comprises processing the audio signal in accordance to human loudness perception;
   converting the first loudness related value into a second loudness related value using a model comprising a reversible relation; wherein the second loudness related value is associated with a second procedure for determining loudness related values; wherein the reversible relation is an approximation of the actual relationship between the first and second loudness related values, and is given by either:
   $L_2 = A + BL_1$
   wherein $L_2$ is the second loudness related value measured in dB, $L_1$ is the first loudness related value measured in dB, and either:
   $-17 \leq A \leq -15$ and $-0.7 \leq B \leq -0.9$;
   or:
   $-19 \leq A \leq -18$ and $B = -1.0$;
   or:
   $L_2 = A + BL_1 + CL_1^2$
   wherein $L_2$ is the second loudness related value measured in dB, $L_1$ is the first loudness related value measured in dB and A, B and C are real numbers;

storing the second loudness related value in metadata associated with the audio signal; and providing the metadata to the media player to enable the media player to render the audio signal using the second loudness related value.

2. The method of claim 1, wherein the first and/or the second procedure comprise:
   determining the energy of time intervals of the processed audio signal; and
   calibrating the energy to determine a loudness related value.

3. The method of claim 2, wherein:
   the first procedure is the ITU-R BS.1770 algorithm or a variant thereof to measure audio programme loudness; and
   the second procedure is the Replay Gain loudness calculation scheme; and wherein the Replay Gain loudness calculation scheme further comprises computing a gain value from the loudness related value, the gain value being the second loudness related value.

4. The method of claim 1, wherein:
   the metadata comprising the second loudness related value has a pre-determined format;
   the pre-determined format uses the Replay Gain syntax; and/or
   the pre-determined format comprises iTunes-style metadata or ID3v2 tags.

5. The method of claim 1, wherein:
   the reversible relation has been determined based on a plurality of calculated first and second loudness related values for a plurality of audio signals;
   the reversible relation has been determined using linear regression;
   the reversible relation has been determined using segmented linear regression; and/or
   the reversible relation has been determined using an error minimization scheme.

6. The method of claim 5, wherein the reversible relation between the first loudness related value and the second loudness related value measured in the logarithmic space is a linear relation.

7. The method of claim 1, wherein the step of providing the metadata to the media player comprises transmitting the audio signal and the metadata to the media player.

8. The method of claim 1, further comprising:
   extracting the second loudness related value from the metadata; and
   rendering the audio signal using the second loudness related value.

9. The method of claim 8, further comprising:
   converting the second loudness related value into the first loudness related value using the reversible relation; and
   rendering the audio file using the first loudness related value.

10. The method of claim 1, wherein the step of converting the first loudness related value into a second loudness related value further comprises offsetting the first loudness related value by a predetermined value if the audio signal is a mono signal.

11. A loudness encoder configured to determine perceptually relevant loudness related values for loudness normalization at a media player; the loudness encoder configured to
   provide a first loudness related value associated with an audio signal; wherein the first loudness related value has been determined according to a first procedure; wherein the first procedure comprises processing the audio signal in accordance to human loudness perception;
   convert the first loudness related value into a second loudness related value using a model comprising a reversible relation; wherein the second loudness related value is associated with a second procedure for determining loudness related values; wherein the reversible relation is an approximation of the actual relationship between the first and second loudness related values, and is given by either:
   $L_2 = A + BL_1$
      wherein $L_2$ is the second loudness related value measured in dB, $L_1$ is the first loudness related value measured in dB, and either:
         $-17 \leq A \leq -15$ and $-0.7 \leq B \leq -0.9$;
      or:
         $-19 \leq A \leq -18$ and $B = -1.0$;
   or:
   $L_2 = A + BL_1 + CL_1^2$
      wherein $L_2$ is the second loudness related value measured in dB, $L_1$ is the first loudness related value measured in dB and A, B and C are real numbers; and
   store the second loudness related value in metadata associated with the audio signal; wherein the metadata enables a media player to render the audio signal using the second loudness related value.

12. A media player, configured to
   extract a second loudness related value from metadata associated with an audio signal; wherein the second loudness related value is associated with a second procedure for determining loudness related values;
   convert the second loudness related value into a first loudness related value using a model comprising a reversible relation; wherein the first loudness related value has been determined according to a first procedure; wherein the reversible relation is an approximation of the actual relationship between the first and second loudness related values; wherein the first procedure comprises processing the audio signal in accordance to human loudness perception; and
   render the audio signal using the first loudness related value.

13. A method for rendering an audio signal at a media player using a first loudness related value, the method comprising:
   receiving metadata associated with the audio signal at the media player;
   extracting a second loudness related value from the metadata associated with the audio signal; wherein the second loudness related value is associated with a second procedure for determining loudness related values;
   converting the second loudness related value into a first loudness related value using a model comprising a reversible relation; wherein the first loudness related value has been determined according to a first procedure; wherein the reversible relation is an approximation of the actual relationship between the first and second loudness related values; wherein the first procedure comprises processing the audio signal in accordance to human loudness perception; and
   rendering the audio signal using the first loudness related value.

14. The method of claim 13, wherein the step of rendering comprises:
   applying a value derived from the first or second loudness related value to samples of the audio signal; and/or
   controlling the dynamic range of the loudness processed audio signal; and/or limiting the loudness processed audio signal to avoid clipping.

15. The method of claim 13, wherein the audio signal is represented in a media format being one of: mp3, AAC, HE-AAC, OGG, WMA, Dolby Digital, Dolby Digital Plus, or Dolby Pulse.

16. A non-transitory storage medium comprising a software program adapted for execution on a processor and for performing the steps of
providing a first loudness related value associated with an audio signal; wherein the first loudness related value has been determined according to a first procedure; wherein the first procedure comprises processing the audio signal in accordance to human loudness perception;
converting the first loudness related value into a second loudness related value using a model comprising a reversible relation; wherein the second loudness related value is associated with a second procedure for determining loudness related values; wherein the reversible relation is an approximation of the actual relationship between the first and second loudness related values, and is given by either:
$L_2 = A + BL_1$
wherein $L_2$ is the second loudness related value measured in dB, $L_1$ is the first loudness related value measured in dB, and either:
$-17 \leq A \leq -15$ and $-0.7 \leq B \leq -0.9$;
or:
$-19 \leq A \leq -18$ and $B = -1.0$;
or:
$L_2 = A + BL_1 + CL_1^2$
wherein $L_2$ is the second loudness related value measured in dB, $L_1$ is the first loudness related value measured in dB and A, B and C are real numbers;
storing the second loudness related value in metadata associated with the audio signal; and
providing the metadata to the media player to enable the media player to render the audio signal using the second loudness related value.

17. A non-transitory storage medium comprising a software program adapted for execution on a processor and for performing the steps of
receiving metadata associated with the audio signal at the media player;
extracting a second loudness related value from the metadata associated with the audio signal; wherein the second loudness related value is associated with a second procedure for determining loudness related values;
converting the second loudness related value into a first loudness related value using a model comprising a reversible relation; wherein the first loudness related value has been determined according to a first procedure; wherein the reversible relation is an approximation of the actual relationship between the first and second loudness related values; wherein the first procedure comprises processing the audio signal in accordance to human loudness perception; and
rendering the audio signal using the first loudness related value.

* * * * *